United States Patent [19]

Albertinsky et al.

[11] 4,441,150
[45] Apr. 3, 1984

[54] HIGH-VOLTAGE RECTIFIER UNIT

[76] Inventors: Boris I. Albertinsky, Nevsky prospekt 84, kv. 19, Leningrad; Nina M. Dmitrieva, Pavlovskaya ulitsa, 84, kv. 11, Kolpino; Anatoly K. Evseev, Bukharestskaya ulitsa, 33, korpus 1, kv. 25, Leningrad; Ivan P. Zotov, poselok Metallostroi, Pushkinskaya ulitsa, 8, kv. 50, Leningrad; Andrei S. Ivanov, ulitsa Kuznetsovskaya ulitsa, 8, kv. 33, Leningrad; Mikhail P. Sviniin, poselok Metallostroi ulitsa Bogaichuka, 4, kv. 25, Leningrad; Valentin A. Suslov, ulitsa Petra Smorodina, 12, kv. 130, Leningrad; Mikhail T. Fedotov, poselok Metallostroi, Polevaya ulitsa, 22, kv. 58, Leningrad, all of U.S.S.R.

[21] Appl. No.: 336,395

[22] PCT Filed: Apr. 25, 1980

[86] PCT No.: PCT/SU80/00066
§ 371 Date: Dec. 21, 1981
§ 102(e) Date: Dec. 21, 1981

[87] PCT Pub. No.: WO81/03093
PCT Pub. Date: Oct. 29, 1981

[51] Int. Cl.³ .............................................. H02M 7/06
[52] U.S. Cl. ...................................... 363/126; 357/76; 357/80; 357/84
[58] Field of Search ................ 363/125, 126, 144–146; 361/424; 357/76–77, 80, 84

[56] References Cited

U.S. PATENT DOCUMENTS 3,718,850  2/1973  Juri et al. ............................ 363/144
4,007,402  2/1977  Allport ............................ 363/126 X
4,344,126  8/1982  Schumacher ...................... 363/126

FOREIGN PATENT DOCUMENTS 1229638 12/1966 Fed. Rep. of Germany .
  89951  8/1958 Netherlands .
 853913 11/1960 United Kingdom .
1051260 12/1966 United Kingdom .
 208144 12/1967 U.S.S.R. .
 546128  2/1977 U.S.S.R. .

OTHER PUBLICATIONS

"500 KV and 10 A Load Current Rectifier", by V. A. Gaponov, A. I. Grishchenko, S. S. Zhukovsky, V. S. Nikolaev, R. A. Salimov, and E. P. Semenov; Novosibrisk 1974; pp. 1–17 w/English translation.

Primary Examiner—Peter S. Wong
Attorney, Agent, or Firm—Fleit, Jacobson, Cohn & Price

[57] ABSTRACT

A high voltage rectifier unit comprises a vessel filled with an electrically insulating fluid and accommodating a transformer having a sectionalized secondary winding, each section 7 of which is provided with a metallic shield and includes two coils 9, a high-voltage lead 27, rectifier devices 15 mounted on supporting insulators 25. Each section of the secondary winding of the transformer is connected with one of the rectifier devices 5 and forms a rectification stage. The metallic shields are made as open metallic rings 10 separated by insulating rings 18. On the outer surface of each of the metallic rings 10 are secured coils 9 of one of the sections 7 of the secondary winding, connected with the metallic ring 10 by inner leads 11 of each coil 9 of the section 7 of the secondary winding.

4 Claims, 2 Drawing Figures

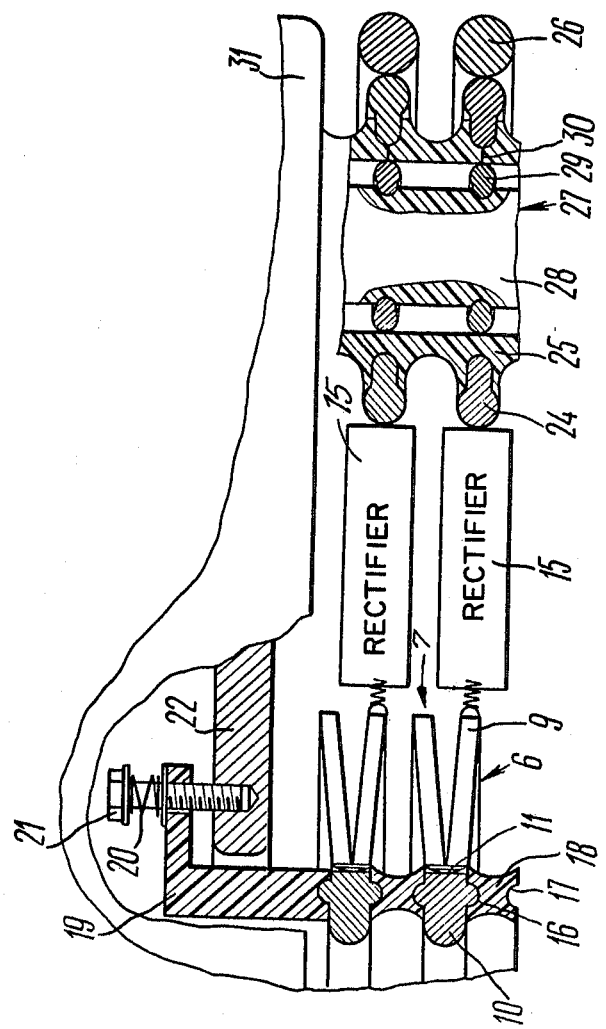

HIGH-VOLTAGE RECTIFIER UNIT

FIELD OF THE INVENTION

The present invention relates to high-voltage power supplies, and more particularly, to high-voltage rectifier units.

BACKGROUND OF THE INVENTION

A high-voltage rectifier unit is a device intended for conversion of a low-voltage alternating current into a high-voltage direct current. Devices designed for converting an alternating-current voltage into a direct-current one are well known and widely used in various fields of technology to supply electric and electronic devices, motors and the like. A transformer and a rectifier means are their basic elements. Depending upon the application and the parameters of high-voltage rectifier units they employ transformers of various power and type, while vacuum tubes and semiconductor devices with a unidirectional conduction are used as the rectifier means. Certain high-voltage rectifier units employ a plurality of rectifier means connected in series or in parallel and forming an integral construction element which is a rectifier device. The high-voltage rectifier unit operates as follows.

The alternating-current voltage to be converted into a direct-current voltage of a desired value is applied to the primary winding of the transformer whereas the secondary winding of the transformer supplies an alternating-current voltage to the rectifier means of rectifier devices which are interconnected and connected to the secondary winding of the transformer.

A load is connected in series with the output of the rectifier devices so that the current flowing through it is unidirectional as in the rectifier devices, i.e. is a direct current.

The value of the rectified voltage depends upon the transformer type and the voltage applied. The value of the rectified voltage can be adjusted by changing the voltage applied to the primary winding of the transformer. The unavoidable ripple of the rectified voltage can be reduced or eliminated by the use of special electric filters as well as by selecting an appropriate rectification circuit.

Most problems arise in construction of high and superhigh voltage rectifier units. In these cases, special measures are to be taken to provide the required dielectric strength of the rectifier unit by increasing the insulating gaps, the overall dimensions of the rectifier unit thus growing extraordinarily. This makes impossible to use them in an open construction for certain applications. It is especially difficult to construct high-voltage rectifier units for tens and hundreds of kilovolts. In this event the principal elements of the high-voltage rectifier unit—the transformer and the rectifier devices—are enclosed in a hermetically sealed vessel filled with an electrically insulating fluid, for example, transformer oil or insulating gas. In order to increase the dielectric strength of the gas it is usually used under pressure of several atmospheres. The high rectified voltage is derived from the rectifier unit through the vessel walls to a load located outside the vessel, using a high-voltage lead.

Known in the prior art is a high-voltage rectifier unit (cf. USSR Author's Certificate No. 546 128 dated 1976) that comprises a three-phase transformer, rectifier devices mounted on supporting insulators, a high-voltage electrode, and a high-voltage lead all enclosed in a vessel, filled with an electrically insulating fluid.

However, the construction features of the high-voltage rectifier unit mentioned hereinabove enlarge its overall dimensions and increase its weight since the axial dimension of the high-voltage rectifier unit is increased due to three insulating gaps used to provide the specific conditions of operation for this rectification circuit. The normal operation of the rectifier unit requires high-voltage insulation between circuit elements which have different potentials. In the high-voltage rectifier unit under consideration using the three-phase bridge circuit, the beginnings of the transformer secondary windings connected to the rectifier devices should be insulated from grounded parts of the transformer magnetic core, and this is provided by respective insulating gaps. The ends of the secondary windings interconnected in a common point should be insulated from the high-voltage electrode located above the secondary windings. This is provided by one more insulating gap. The high-voltage electrode should be also insulated, in turn, from the grounded parts of the transformer magnetic core. This is provided by a respective insulating gap. The three high-voltage insulating gaps not only increase the outline dimensions of the vessel and its weight, but also the length of the magnetic core, i.e. the amount of electrical steel used. This leads, in turn, to an increase in the electric loss and to a decrease in technical and economical characteristics of the high-voltage rectifier unit.

Furthermore, the increased number of high-voltage gaps reduces the service reliability of the high-voltage rectifier unit owing to an increased probability of electric breakdowns therein.

In the high-voltage rectifier unit mentioned above, rectifier devices are used that operate at a reverse voltage applied thereto that exceeds the high rectified voltage. At the present time, rectifier devices for such high voltages are not commercially available. Hence, the implementation of such a high-voltage rectifier unit requires a special construction of rectifier device made up of a plurality of standard rectifier means connected in series. This also reduces the service reliability of the high-voltage rectifier unit owing to a non-uniform voltage distribution among rectifier means of the rectifier device. The latter occurs mainly owing to capacitive currents flowing between rectifier means of the rectifier device and structure elements of the high-voltage rectifier.

Transient conditions caused, for example, by a short-circuit in the load or a breakdown of the insulating gaps produce particularly unfavourable voltage distribution among the rectifier means in such a rectifier device. The voltage across certain rectifier means can reach an intolreable value at which the rectifier means can fail. A similar situation can take place also in the secondary winding of the transformer made as a single cylindrical coil with a very large number of turns. Here transients can produce overvoltages between adjacent turns, that can damage the turn-to-turn insulation. As a result the replacement of the entire secondary winding coil may become necessary. The reliability of the high-voltage rectifier unit is also impaired by the use of supporting insulators used for mounting the secondary windings and rectifier devices. The insulator length is known to increase not directly as the voltage increases since this is accompanied by a reduction in the breakdown voltage.

At high voltages the probability of breakdown increases for long supporting insulators due to local field intensities on the insulator, arising from non-uniform electric-charge distribution over its surface.

Also known to the prior art is a high-voltage rectifier unit (pre-print No. 74-11, 1974, IJaF AN SSSR) comprising, arranged in a vessel filled with an electrically insulating fluid, a transformer having a sectionalized secondary winding each section of which is provided with a metallic shield and includes two coils interconnected in series by the shield, each being provided with an inner and an outer lead, a high-voltage electrode, a high-voltage lead, rectifier devices installed on supporting insulators, each section of the secondary winding of the transformer being connected with one of the rectifier devices by means of one of the outer leads and forming a rectification stage. The direct-current voltage rectification stages are connected in series so that the voltages of the rectification stages are added, whereby at the output of the last stage connected with the high-voltage electrode the required high voltage is developed. This voltage is applied to a load installed outside the vessel by means of the high-voltage lead made as a high-voltage through insulator mounted on the vessel.

The high-voltage rectifier unit described hereinabove has only one high-voltage gap, i.e. the gap between the high-voltage electrode and the grounded parts of the transformer magnetic core and those of the vessel. Since the secondary winding is sectionalized, the insulating gaps between the beginning of first stage coil windings and the earthed parts of the transformer magnetic core and of the vessel as well as those between the ends of the last stage coil windings and the high-voltage electrode are made minimum and designed for the voltage of one stage only. As a result, the axial dimension of this high-voltage rectifier unit is reduced, and the length of the transformer magnetic core is shortened as compared to other prior art rectifier units. Thus, the overall dimensions of the high-voltage rectifier unit and its weight are reduced. At the same time the service reliability of the high-voltage rectifier unit is improved due to the reduction in the number of high-voltage insulating gaps designed for the full rectified voltage. The shortened length of the transformer magnetic core enables the amount of metal used for the transformer manufacturing to be reduced whereby, its electrical loss is also reduced. This improves the technical and economical characteristics of the unit. The sectionalized secondary winding opens the way for the use of commercially available rectifier devices, i.e. rectifier devices designed for the voltage rectified in each stage, which is lower than the high output voltage and depends upon the number of stages. The number of stages can be selected depending upon the required high voltage and the allowable voltage of each rectifier device. Therefore the number of rectifier means connected in series in a rectifier device of the stage is reduced to a minimum, thus improving the service reliability of the high-voltage rectifier unit.

The number of turns in coils of each section is also reduced as a result of the use of the sectionalized secondary winding, and, hence, the probability of section coil failure during transients is decreased, i.e. the service reliability of the high-voltage rectifier unit is improved as well.

At the same time in case of a damage of the secondary winding, only damaged sections should be replaced and not the entire secondary winding.

In the high-voltage rectifier unit mentioned hereinabove, individual supporting insulators designed for the voltage of one stage are installed instead of the supporting insulators designed for the full high voltage. It is known that the sectionalized insulator with a forced uniform potential distribution along its height possesses a higher dielectric strength. This results in a higher service reliability of the high-voltage rectifier.

However, this high-voltage rectifier is a rather complicated one, since it includes a great number of elements interconnecting separate parts, as well as a great number of rectifier means. Actually, three insulation plates are used in each stage for installation of the rectifier devices in this high-voltage rectifier, and these plates are, in turn, installed on three supporting insulators. Each section of the secondary winding is secured to respective insulation plates.

Thus, the whole assembly of the sections and the rectifier devices forms a stack including a great number of insulating elements. In such a stack the stiff fitting of sections to the insulation plates cannot provide a coaxial arrangement of the secondary winding with respect to the primary winding of the transformer due to a great number of connecting elements, which can lead local electric-field non-uniformities in the gap between the primary winding and the secondary winding and, as a result, to a reduced dielectric strength of this insulating gap and, hence, to a decreased reliability.

Furthermore, the service reliability of such a high-voltage rectifier unit is also impaired as the number of insulating elements increases.

The above mentioned construction of the high-voltage rectifier unit requires complete disassembling of rectification stages to replace a damaged rectifier means.

Moreover, the stiff fitting of the sections to the insulation plates can cause a damage to the coils, which also impairs the reliability of the high-voltage rectifier unit.

Thus, the prior art high-voltage rectifier unit is of a complicated design and has a relatively low service reliability. It is an object of the present invention to improve the reliability and to simplify the design of the high-voltage rectifier unit.

SUMMARY OF THE INVENTION

The principal object of the present invention is to provide such a high-voltage rectifier unit wherein the sectionalized secondary winding should be made so as to comprise the minimum number of insulating and connecting elements.

With this principal object in view there is proposed a high-voltage rectifier unit comprising a vessel filled with an electrically insulating fluid, a transformer located in said vessel and having a sectionalized secondary winding each section of which is provided with a metallic shield and includes two coils interconnected by the shield, each coil having an inner lead and an outer lead, a high-voltage electrode, a high-voltage lead, rectifier devices installed on supporting insulators, each section of the secondary winding of the transformer being connected with one of the rectifier devices by means of one of the outer leads and forming a rectification stage, wherein, according to the invention, the metallic shield of each section of the secondary winding of the transformer is made as an open metallic ring, said metallic rings being separated by insulating rings, each coil of each section of the secondary winding is secured on the outer surface of each of the metallic rings and is connected with the metallic ring by its inner lead all said rings being joined together to form a single stiff structure.

Such a construction of the sectionalized secondary winding of the high-voltage rectifier unit, wherein the metallic shields of each of transformer secondary winding section are made as open metallic rings having insulating rings therebetween and wherein the coils of one of the secondary winding sections are secured on the external surface of each of the metallic rings and are connected with the metallic ring by their internal leads improves the reliability and simplifies the construction of the unit.

It is advisable in accordance with the invention to link the metallic shields and the insulating rings with each other by means of grooves receiving the respective projections.

Such a connection of the metallic and insulating rings provides for a high accuracy of assembling and an additional reliability when secondary winding sections are manufactured.

These and other objects and advantages of the present invention will become fully apparent from the following description of its one embodiment taken in conjunction with the accompanying drawings.

BRIEF DESCRIPTION OF THE DRAWINGS

FIG. I is a top view of the high-voltage rectifier unit, in accordance with the present invention;

FIG. 2 is a sectional view taken through line II—II of FIG. I in accordance with the present invention.

Figure 1:
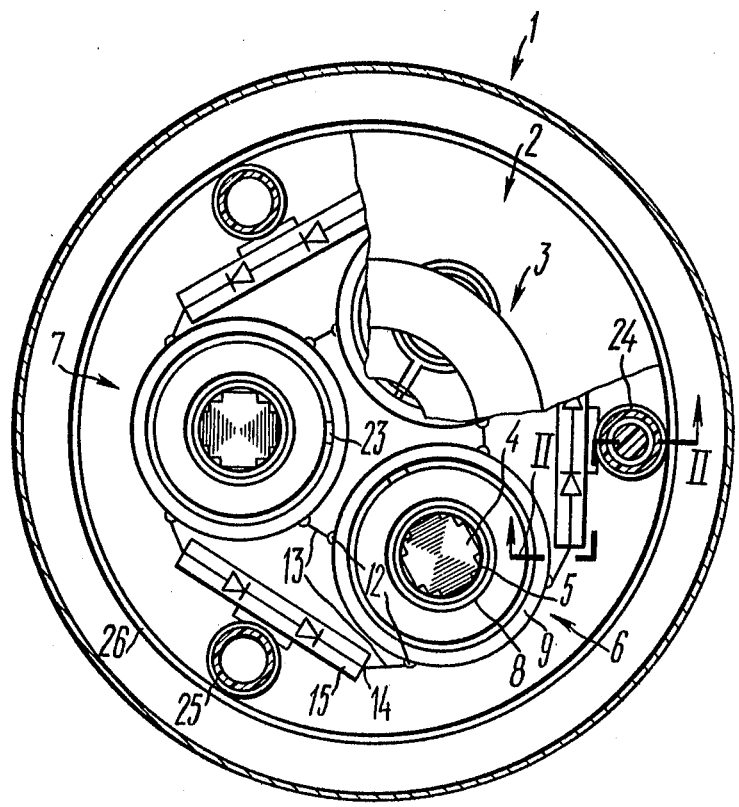

It should be noted that the accompanying drawings are represented diagrammatically and serve the purpose of illustrating the spirit of the present invention and the possibility of its implementation without any limitations as to the dimensions of parts included into the high-voltage rectifier unit, the ratios of element dimensions, the number of rectification stages and their schematic diagrams. The proposed high-voltage rectifier unit in accordance with the present invention can be best made as follows.

BEST MODE FOR CARRYING OUT THE INVENTION

The high-voltage rectifier unit comprises a vessel I (FIG. 1) filled with an electrically insulating fluid that is a compressed gas $SF_6$, wherein a three-phase transformer 2 is enclosed. The transformer 2 includes a triple-bar closed magnetic core 3 with bars 4. Mounted on the bars 4 are primary windings 5 and secondary windings 6. The secondary windings 6 are made as individual sections 7 (FIG. 2). The primary windings 5 (FIG. I) are enclosed in open metallic shields 8. Each section 7 (FIG. 2) of the secondary winding 6 comprises two coils 9 and a metallic shield made as an open metallic ring 10 having the coil 9 secured thereon. Inner leads 11 of each of the coils 9 are connected with the metallic ring 10 so that in each section 7 the coils 9 are connected in series. The beginnings of the coils 9 (FIG. I) are connected, by means of outer leads 12 and a spring contact 13, with respective leads 14 of rectifier devices 15. The ends of the coils 9 are connected, by means of their outer leads 12 and also by means of the contact spring 13, with similar ends of the coils 9 of two other sections 7 (FIG. 2). Thus, every three sections 7 of the secondary winding 6 of the transformer 2 (FIG. I) and respective rectifier devices 15 form a rectification stage. The number of such stages is thirty. The sections 7 (FIG. 2) of every phase of the secondary winding 6 are joined in a single stiff structure coaxially with the primary winding 5 (FIG. I) by means of an annular projection 16 (FIG. 2) on the metallic shield of the section 7 and a respective groove 17 in an insulating ring 18. In order to provide for the accuracy of assembling and the stiffness of the structure of the entire secondary winding 6 the metallic ring 10 and the insulating rings 18 are compressed by a flange 19 by the action of a pressure spring 20. The compression force is adjusted by a bolt 21 screwed into a plate 22. In order to prevent the formation of a short-circuited turn, the metallic rings 10 are made as incomplete metallic rings with a radial cut 23 (FIG. I) that is filled with an epoxy compound. The rectifier devices 15 have two arms and are secured in the central point to metallic rings 24 (FIG. 2) installed on supporting insulators 25. In every rectification stage the metallic rings 24 of the supporting insulators 25 are interconnected by an external ring 26. Thus the number of the rings 24 and 26 is equal to the number of the rectification stages.

In addition to the functions mentioned hereinabove, the rings 24 perform the potential distribution over the surface of the supporting insulator 25 whereas the rings 26 equalize the electric field between the high-voltage assembly and the walls of the vessel I (FIG. I), thus improving the service reliability of the high-voltage rectifier unit. The rectifier devices 15 are installed on the supporting insulators 25 in such a manner that one lead 14 of the rectifier device 15 lies in an equipotential plane with the lead 12 of the section 7 mounted on the core of one phase whereas the other lead 14 (FIG. I) of the rectifier device 15 lies in the equipotential plane with the lead 12 of the section 7 of the adjacent rectification stage, but mounted on the core of the other phase. Said feature of connection of the rectifier devices 15 (FIG. I) to the sections 7 (FIG. 2) is due to the fact that one arm of the rectifier device 15 is a rectifier means of one rectification stage whereas its other arm is that of the adjacent stage mounted above the first one. Arranged inside one of the supporting insulators 25 is a high-voltage lead 27 made of a high-voltage cable 28 with metallic rings 29 secured thereon. Pins 30 connect electrically the rings 29 of the high-voltage cable 28 with the respective ring 24 of the supporting insulator 25. The cable splicing length of the high-voltage lead 27 corresponds to that of the supporting insulator 25 and, therefore, does not increase the outline dimensions of the high-voltage rectifier unit.

The high-voltage cable 28 is connected with the plate 22 where a high-voltage electrode 31 is installed. The high-voltage cable 28 is brought out from the vessel 1 (FIG. I) and is connected to the load. The operation of the high-voltage rectifier unit in accordance with the present invention is similar to that of any rectifier unit using the known three-phase bridge circuit comprising a three-phase transformer. All thirty rectification stages connected in series for the direct-current voltage by their rectifier devices employ the same circuit. Thus, the output voltage of the last rectification stage is the sum of rectified voltages of all stages. The value of the high rectified voltage is adjusted by the value of the alternating current voltage applied to the primary winding of the transformer.

COMMERCIAL APPLICABILITY

Most successfully the present invention can be implemented in accelerating equipment as a source of accelerating voltage for high-power accelerators of direct action intended for various installations of the radiation chemistry using accelerated electrons for treating different materials to impart new useful properties to them or to produce new products.

The present invention can be also employed to supply a high-direct-current voltage to various devices where it is required, for example, for testing different high-voltage equipment.

The high-voltage rectifier unit according to the present invention reduces the preventive maintenance time, saves material (steel, insulating materials) and features high reliability and design simplicity.

We claim:
1. A high-voltage rectifier unit comprising
   a vessel filled with an electrically insulating fluid;
   a transformer accommodated in said vessel and having a sectionalized secondary winding, each section of which is provided with a metallic shield and includes two coils connected in series by said shield, each coil having an inner and an outer lead;
   rectifier devices mounted on supporting insulators, each section of the secondary winding of the transformer being connected with one of the rectifier devices by means of one of the outer leads and forming a rectification stage, the metallic shield of each section of the secondary winding of the transformer being made as an open metallic ring, the metallic rings of adjacent sections being separated by insulating rings, and each coil of each section of the secondary winding being secured on the outer surface of one of the metallic rings and being connected with the metallic ring by its inner lead, said metallic and said insulating rings being joined together to form a single stiff structure.

2. A high-voltage rectifier according to claim 1, wherein one of the metallic ring and the insulating ring is provided with grooves and the other of the metallic ring and the insulating ring is provided with projections, the grooves cooperating with the projections to link a metallic ring with an adjacent insulating ring.

3. A high-voltage rectifier unit comprising a vessel filled with an electrically insulating fluid and accommodating a transformer having at least (a) a sectionalized secondary winding, each section of which is provided with a metallic shield and two coils connected in series by said shield, (b) each of the coils having an inner and an outer lead, (c) a high-voltage electrode, (d) a high-voltage lead, and (e) rectifier devices mounted on supporting insulators, each section of the secondary winding of the transformer being connected with one of the rectifier devices by one of the outer leads and forming rectification stages, characterized in that,
   the metallic shields of each section of the secondary winding of the transformer are made in the form of open metallic rings separated by insulating rings,
   the outer surface of each of the metallic rings carrying coils of one of the sections of the secondary winding,
   said coils being connected to the metallic ring by inner leads of each of the coils of the section of the secondary winding, and
   all the metallic and insulating rings being joined together to form a single rigid structure.

4. A high-voltage rectifier unit as claimed in claim 3, characterized in that the metallic rings and the insulating rings are joined together by grooves and corresponding projections.

* * * * *